(12) United States Patent
Shafeeu

(10) Patent No.: US 7,295,820 B2
(45) Date of Patent: Nov. 13, 2007

(54) METHOD AND APPARATUS FOR DC OFFSET CONTROL

(75) Inventor: Hassan Shafeeu, Berkshire (GB)

(73) Assignee: Synad Technologies Limited, Reading (GB)

( * ) Notice: Subject to any disclaimer, the term of this patent is extended or adjusted under 35 U.S.C. 154(b) by 519 days.

(21) Appl. No.: 10/833,499

(22) Filed: Apr. 27, 2004

(65) Prior Publication Data

US 2004/0266381 A1 Dec. 30, 2004

(30) Foreign Application Priority Data

Apr. 30, 2003 (GB) .................................. 0309937.1

(51) Int. Cl.
*H04B 17/02* (2006.01)
*H04B 1/06* (2006.01)

(52) U.S. Cl. ................ 455/136; 455/250.1; 455/232.1

(58) Field of Classification Search ................ 455/260, 455/259, 262, 136, 138, 245.1, 250.1, 232.1, 455/246.1, 251.1, 240.1, 137
See application file for complete search history.

(56) References Cited

U.S. PATENT DOCUMENTS

| | | | | |
|---|---|---|---|---|
| 4,441,080 A | * | 4/1984 | Saari | 330/86 |
| 5,459,679 A | * | 10/1995 | Ziperovich | 708/3 |
| 6,144,243 A | * | 11/2000 | Vaisanen | 327/307 |
| 6,356,218 B1 | * | 3/2002 | Brown et al. | 341/120 |
| 6,407,630 B1 | * | 6/2002 | Yao et al. | 330/9 |
| 6,941,121 B2 | * | 9/2005 | Chen | 455/232.1 |
| 6,975,845 B2 | * | 12/2005 | Vihonen et al. | 455/249.1 |
| 2002/0075892 A1 | * | 6/2002 | Bezooijen et al. | 370/442 |
| 2005/0250459 A1 | * | 11/2005 | Tervaluoto et al. | 455/127.2 |
| 2005/0258989 A1 | * | 11/2005 | Li et al. | 341/120 |
| 2005/0276358 A1 | * | 12/2005 | Pipilos | 375/345 |

FOREIGN PATENT DOCUMENTS

| | | |
|---|---|---|
| JP | 58051612 | 3/1983 |
| JP | 5219410 | 8/1993 |
| JP | 6053789 | 2/1994 |
| JP | 2001077640 | 3/2001 |
| JP | 2004096324 | 3/2004 |

OTHER PUBLICATIONS

UK Search Report, GB0309937.1, dated Sep. 15, 2004.

* cited by examiner

*Primary Examiner*—Sonny Trinh
(74) *Attorney, Agent, or Firm*—Jenkens & Gilchrist, PC

(57) ABSTRACT

An automatic gain control (AGC) circuit has an automatic gain controlled amplifier connected in series with a DC blocking capacitor. A reference DC voltage is selectively applied to an input of the automatic gain controlled amplifier and to an output of the DC blocking capacitor output so as to cause the DC blocking capacitor to store a charge proportional to a DC voltage offset introduced by the controllable gain amplifier. The selectively application of the reference DC voltage is momentarily applied for a duration of less than about 1 microsecond and preferably about 0.4 microseconds. The AGC circuit, including both the amplifier and capacitor, are fabricated as an integrated circuit device.

31 Claims, 2 Drawing Sheets

METHOD AND APPARATUS FOR DC OFFSET CONTROL

PRIORITY CLAIM

The present application claims priority from United Kingdom Application for Patent No. 0309937.1 filed Apr. 30, 2003, the disclosure of which is hereby incorporated by reference.

BACKGROUND OF THE INVENTION

1. Technical Field of the Invention

The present invention relates to a method and apparatus for DC offset cancellation, particularly but not exclusively in Automatic Gain Control circuits for zero intermediate frequency (ZIF) receivers.

2. Description of Related Art

In wireless communication systems, it is well known to convert the high frequency signal, received at an antenna, directly into a baseband signal without first being converted to an intermediate frequency. A block diagram of a generic zero intermediate frequency (ZIF), also known as a homodyning, circuit 10 is shown in FIG. 1. RF signals are received at an antenna 20 and are passed through a low noise amplifier arrangement 30 into a mixer 40. The output of the mixer 40 is a baseband signal. The baseband signal is pre-amplified at a receiver amplifier 50 which is AC coupled to a receiver filter 60, having common mode feedback, via an AC coupling capacitor 70. The baseband signal, filtered to remove higher harmonics by the filter 60, enters an AGC circuit 80 which amplifies the baseband signal further.

An AGC circuit is a cascade of individual AGC amplifiers that work together to scale the very small voltages received by the antenna system 20 up to a signal that is large enough to work within the processing block of the receiver. A cascade of amplifiers is used rather than a single amplifier to avoid the requirement of a single very large gain amplifier. Amplifiers with larger gains tend to have less linear amplification curves, which results in a distorted signal that is harder to process.

The baseband output of AGC circuit 80 is capacitively coupled to a buffer 85, which is typically unity gain but may be a 2× buffer amplifier for example. The output of the buffer 85 is passed to an analog to digital converter (ADC) 90 after which further signal processing (not shown) occurs.

It is well known that ZIF receivers introduce error signals in the form of DC offset signals, at various stages in the receiver. If left uncorrected, such signals can cause difficulties in later stages, for example errors in baseband digitization or saturation of the ADC 90. There are several sources of such DC offset in a ZIF transceiver. The AC coupling capacitor 70 between the pre-amplifier 50 and the filter 60 removes any DC offsets in the mixer 40 and pre-amplifier 50 before they reach the AGC circuit 80 or filter 60, and avoids the need for a feedback loop from the output of the filter 60 back to the pre-amplifier 50 (the common mode feedback is instead about the filter alone, as shown in FIG. 1).

The AGC circuit 80 also has the potential to introduce a DC offset into the filtered baseband signal. The amplifiers in the AGC circuit are voltage differential amplifiers that have a variable voltage gain and amplify the difference between the amplifier inputs at each amplifier in the chain. In practice, the photolithographic and other techniques used to manufacture the transistors that form the differential amplifier result in those transistors not being identical. The result of this is that a proportion of the difference between the differential amplifier outputs is a result of the mismatch between the transistors (for example, a difference in gate areas) and not simply a result of a difference between the amplifier inputs. The amplitude of this DC offset tends to vary as a function of time, temperature and other parameters. The most straightforward way to prevent this AGC DC offset from propagating through to the output of the AGC circuit 80 is to provide an AC coupling capacitor between each amplifier stage to decouple the DC offset from a first amplifier output from the subsequent amplifier stage. Such a solution suffers from a number of problems, particularly when the AGC circuit is amplifying a baseband signal with a large bandwidth and whose frequency extends down to the kHz range. For example, where the ZIF transceiver is part of a Wireless LAN (WLAN) operating with the 802.11a, 802.11b or other standard, the baseband frequency extends from tens of MHz down to perhaps 100 kHz.

The AC coupling capacitors in an AGC circuit act effectively as high pass filters because the input impedance of each subsequent amplifier provides the resistive component of each such RC filter. Thus, in order to allow the baseband signal to be amplified substantially without attenuation, it is necessary that the coupling capacitors present a filter cut-off (−3 dB) at no more than, say, 10% of the lower baseband frequency range, i.e., the filter cut-off needs to be around 10 kHz.

When the gain of the amplifiers in the AGC chain is altered, to maintain a constant output amplitude in response to a changing input voltage amplitude, the DC offset changes. The AGC circuit then has a settling period following the change in gain, while the coupling capacitors reach steady state once more. This is related to the time constant R*C. The resistance R of the filter is typically fixed (for example, by the fixed input impedance of the subsequent amplifier in the AGC). In order to avoid attenuating the baseband signal, therefore, it is necessary to employ relatively large capacitances and a relatively lengthy settling time. A further consequence of the large capacitance is that it tends to preclude device integration.

While this settling time may be acceptable for narrowband signals, for wireless LAN signals such as those broadcast using the 802.11a and 802.11b protocols, that settling time is not acceptable. In the worst case scenario of 802.11a, the total time available to recalibrate the dc offset of the AGC may be less than 1 µs. Failure of the AGC circuit to settle in this time period results in errors potentially being introduced into the data contained in the baseband signal, when it is subsequently converted from analog to digital. Decreasing the capacitance to reduce the settling time simply results in the wanted baseband signal being attenuated by the increased high pass filter cut-off frequency.

EP A2 1,172,928 shows an alternative approach to DC offset correction in a ZIF wireless receiver. Here, a dynamic calculation of the error signal value in the baseband signal is performed at the ADC, on each digital sample, using an error correction algorithm. The calculated error is converted to an analog value and subtracted from the baseband signal at the output of the mixers.

Still further approaches are disclosed in U.S. Pat. No. 6,324,230 and U.S. Pat. No. 5,742,899, which seek to provide an improved settling time for the AGC. However, in both cases, the received signal is a narrow band signal.

None of the foregoing arrangements is particularly suitable to address the problem of very fast settling which becomes a requirement in, for example, 802.11 baseband signal DC offset correction. Decreasing the capacitance in a simple AC coupling arrangement simply attenuates the baseband signal, and attempting to use the arrangements of the above-mentioned US patents in particular to attain such fast settling speeds results in complex and potentially unstable feedback control.

The present invention accordingly seeks to provide an improved approach to DC offset correction in an amplifier circuit.

SUMMARY OF THE INVENTION

According to a first aspect of the present invention, there is provided an amplifier circuit for amplifying an input signal which includes an amplifier having an input and an amplifier output with a DC offset. A coupling capacitor has first and second capacitor plates with the first plate being connected to the output of the amplifier. A switching means is arranged to switch the circuit between a first mode and a second mode, In the first mode, a DC reference voltage is isolated from the amplifier and capacitor so that the amplifier amplifies the input signal applied to the amplifier input, and the capacitor blocks the DC offset. In the second mode, the DC reference is connected to the amplifier input and also to the second capacitor plate so that the voltage across the capacitor plates is forced to the DC offset voltage. Detector means detects when a parameter of the circuit changes producing a new DC offset, and causes the switching means to switch momentarily between the first mode thereof and the second mode thereof, to adjust the voltage across the capacitor to the new DC offset, before causing the switching means to switch back again to the first mode.

The use of two modes addresses the twin requirements that the amplifier circuit does not attenuate the lower frequencies of the baseband signal but also settles sufficiently rapidly following a change in the DC offset that data in the baseband signal is not corrupted or lost. When the DC offset changes, for example because the amplifier gain changes (in response to a baseband input amplitude shift), the circuit can move from the previous steady state condition (DC offset 1) to the new steady state condition (DC offset 2) much more rapidly and accurately than previously. The reference DC voltage connected to the amplifier input in common mode produces an output voltage which is the sum of that input reference DC voltage and a DC offset that is a result of imperfections in the amplifier. This is applied to one plate of the coupling capacitor. The other plate is supplied directly with the DC reference voltage. Thus, the DC voltage across the capacitor is very rapidly forced to the DC offset voltage, in preference faster than the training period in an 802.11a or 802.11b signal and preferably somewhat faster than the guard period in an 802.11a signal. Once the new steady state has been established, the circuit may be switched back into the first mode, where the input (baseband) signal is amplified and the DC offset is removed.

In accordance with a further aspect of the present invention, there is provided a method of DC offset control in an amplifier circuit including an amplifier which has an input and an output with a DC offset, and a coupling capacitor having first and second capacitor plates, the first plate being connected to the output of the amplifier. The method comprises detecting a change in a parameter of the circuit, or a change in an input thereto, which causes a change in the DC offset; in response to a detected change in the DC offset. The circuit is switched from a first mode to a second mode. In the first mode, a DC reference voltage is isolated from the amplifier and capacitor so that the amplifier amplifies the input signal applied to the amplifier input and the capacitor blocks the DC offset. In the second mode, the DC reference is connected to the amplifier input and also to the second capacitor plate so that the voltage across the capacitor plates is formed to the DC offset. Then, the circuit is switched back from the second mode to the first mode once the voltage across the capacitor plates has been forced to the new DC offset.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Clients or stations such as personal computers, laptops, personal digital assistants (PDAs) and other portable devices increasingly incorporate network interface cards (NICs) or mini PCI cards into their system architectures so as to allow them to connect wirelessly to each other, either directly or through a base station/access point. In general, clients communicate via an access point (AP) with other devices within the wireless network, or the wired network in a basic service set (BSS), using the distribution service of the distribution system (DS). The NIC of the host PC interfaces with one or more networks, either as a single mode or dual mode connection to an AP. Currently, in single mode, the NIC uses one or other of the two IEEE wireless Standards, 802.11a and 802.11b, operable at different RF carrier frequencies. In dual mode, the NIC uses whichever protocol is preferable at the time, when trying to communicate with the desired AP or other client.

The skilled reader will be familiar with the IEEE 802.11a and b Standards, as well as other standards in development at this time such as 802.11 g. Therefore, a further description of these Standards will not be given.

Figure 1:
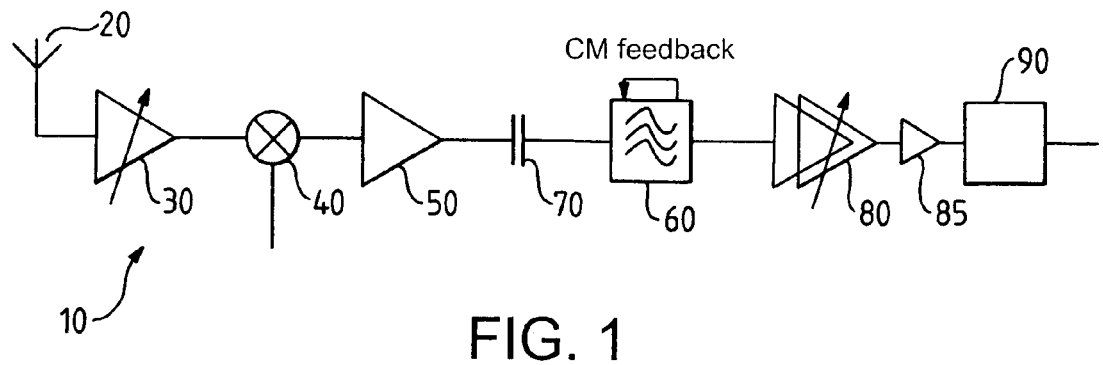
FIG. 1 shows the components of a zero intermediate frequency (ZIF) receiver, including automatic gain control with DC offset correction.
Figure 2:
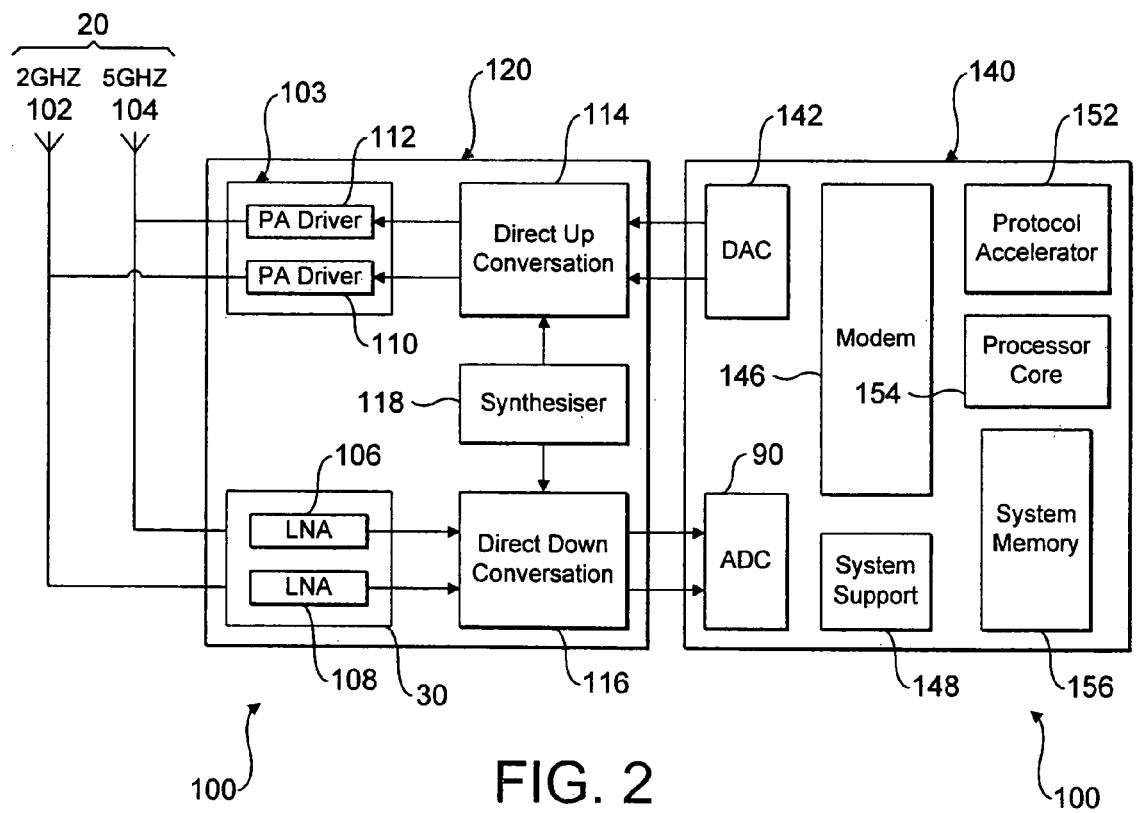
FIG. 2 shows, again, schematically, a typical dual mode wireless LAN transceiver.

Referring to FIG. 2, a typical wireless LAN transceiver 100 is shown. Features common to FIGS. 1 and 2 are labeled with like reference numerals. The transceiver 100 comprises a dual band radio frequency (RF) transmitting and receiving portion 120 and a modem/medium access control (MAC) baseband portion 140 for providing the functionality for integration into the communicating computer system.

The RF portion 120 comprises an antenna system 20 which includes a first antenna 102 for receiving wireless LAN signals in a 2 GHz band, and a second antenna 104 for receiving wireless LAN signals in a 5 GHz band. Power amplifiers (PA) 103 are also provided; a first PA driver 112 is included for signals on the 5 GHz band, and a second PA driver 110 is provided for signals on the 2 GHz band.

The RF portion 120 also has a low noise amplifier arrangement 30 which includes a first low noise amplifier (LNA) 108 for the 2 GHz band and a second LNA 106 for the 5 GHz band.

Finally, within the RF portion 120, a direct up conversion module 114 is provided on the transmit path from the client, and a direct down conversion module 116 is likewise provided on the reception path to the client. A synthesizer 118 supplies local oscillator inputs for both the transmitter and receiver paths in both bands.

The baseband portion of the transceiver 100 comprises an analog to digital converter 144 which digitizes the baseband output of the direct down conversion module 116. There is a corresponding digital to analog converter 142 which converts baseband data on the transmit path into an analog signal for onward processing by the direct up conversion module 114.

The ADC 90 and the DAC 142 respectively provide baseband I/Q receive inputs and transmit outputs along with a general purpose serial interface for configuration and/or testing of the RF portion 120, including the power amplifiers 103. The baseband portion 140 also includes a modem 146 and support system 148, for orthogonal frequency division multiplexing (OFDM) and CCK digital signal processing for the receiver in the transmitter, and MAC portion 150 which includes a processor core unit 154 for providing system software, a system memory unit 156 for storing and buffering data from the processor unit 154, and the protocol accelerator 152. The modem 146 modulates and demodulates signals, and provides functionality between the front end of the baseband portion 140 and the MAC portion 150.

Although a dual mode transceiver is shown in FIG. 1, it is to be understood that the method and apparatus of the present invention are equally applicable to single mode transceivers.

As explained in connection with FIG. 1, the RF portion 120 of the transceiver 100 includes an automatic gain control (AGC) circuit. The purpose of this is to monitor the amplitude of the baseband input and ensure that the baseband output amplitude remains fixed or, at least, within a window that the ADC 90 can accept without saturating. The use of the AGC circuit 80 yields a receiver design whose sensitivity varies based on the received signal strength. This is especially important in a multi (both fast and slow) fading environment that is common to wireless communication channels.

Figure 3:
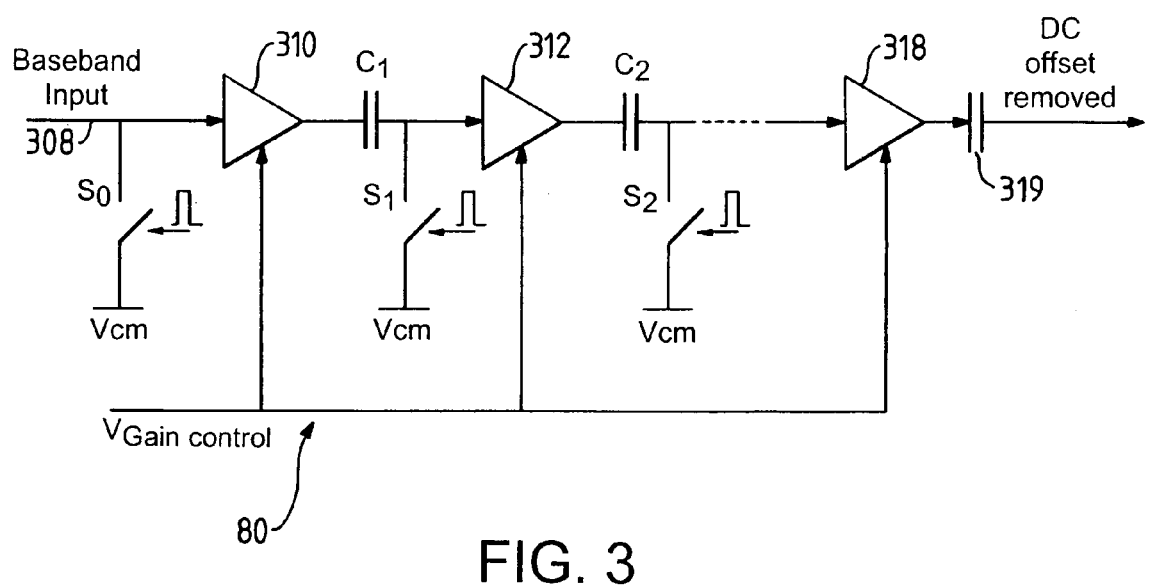
FIG. 3 shows a circuit diagram of an automatic gain controller which embodies the present invention and which may be used in the wireless LAN of FIG. 2

FIG. 3 shows an embodiment of an AGC circuit 80 in accordance with the present invention. The circuit receives, as an input, a pre-amplified baseband signal from the filter 60 (FIG. 1).

The AGC circuit 80 comprises a plurality of operational amplifiers 310, 312. . . 318 which are connected in series. The gain of each operational amplifier is controlled by a common gain control voltage which operates to control the gain of the AGC circuit 80 as a whole, to maintain a relatively constant voltage output amplitude as the baseband input 308 changes. Typically, and preferably, there is feedback control for optimized gain control accuracy but it is also possible to use feed forward control.

The output of each operational amplifier is AC coupled to the input of the subsequent operational amplifier in the chain using a capacitor C1, C2 . . . The AGC circuit 80 is operable in two modes. In a first, "normal" mode, the circuit 80 acts, in essence, in accordance with the prior art arrangement—that is, the baseband input 308 enters the first operational amplifier 310, is amplified with a gain set by the gain control voltage applied to it, and the DC offset generated by the operational amplifier 310 is decoupled from the input to the subsequent operational amplifier 312 by virtue of the capacitor C1. The amplified baseband input signal, with the DC offset generated by the first operational amplifier 310, is then input to the second operational amplifier 312 in the chain, which also introduces a DC offset that is removed using capacitor C2 and so forth through to the last operational amplifier 318. The output of the last amplifier in the chain is coupled via a capacitor 319 to the buffer 85 (FIG. 1) so as to remove the DC offset introduced by that last amplifier.

The capacitance of each capacitor in the chain is chosen so that the AC bandwidth of the circuit 80 is less than around 10 kHz—that is, the high pass filtering operation of the arrangement of FIG. 3 is such as to allow signals of 100 kHz and above (the range of frequencies of a baseband WLAN signal with current standards) to pass substantially unattenuated in this first, normal mode.

The AGC circuit 80 is also operable in a second, gain change mode. When a change in the baseband input amplitude 308 is detected, for example, due to a detected change in the output amplitude of the pre-amplifier 50 (FIG. 1), the gain control voltage applied to each of the operational amplifiers is changed so as, in turn, to change the gain of each of the operational amplifiers to maintain the output voltage amplitude of the AGC circuit 80 relatively constant. Changing the gain of the operational amplifiers causes the DC offset to change, as explained previously. To address the finite and unacceptably long time period that the circuit would otherwise require to reach steady state once more, a reference DC supply voltage $V_{cm}$ is provided and this is connected via a series of switches S0, S1, S2 . . . SN both to the input of each operational amplifier and to one of the plates of each capacitor C1, C2 . . . CN. In the normal mode, each switch is opened so that the circuit operates as previously described. As soon as it is detected that the gain of the circuit is changing, however, a short pulse is supplied to each of the switches S0, S1, S2 which shuts each switch momentarily. Closing each switch causes the input of each operational amplifier 310, 312 . . . 318 momentarily to receive an input signal which is a fixed reference voltage $V_{cm}$. This is supplied, in common mode, to each operational amplifier so that the output of each operational amplifier is $V_{cm}+V_{offset}$. This output voltage is applied to one of the plates of the subsequent capacitor (for example, the output of the first operational amplifier 310 is applied to one of the plates of the capacitor C1). Since all of the switches are closed simultaneously, the other plate of each capacitor, that is, the plate not connected to the output of the preceding operational amplifier, is supplied with the reference voltage $V_{cm}$. Thus, the charge stored on each capacitor is proportional to $(V_{cm}+V_{offset})-V_{cm}$, i.e. $V_{offset}$.

In other words, each AC coupling capacitor is forced to reach its new steady state, following a change in the gain of the circuit 80, extremely rapidly by the supply of a reference voltage through the low resistance of the switch. The circuit is thus able to reach the new steady state much more quickly than it would do if it was simply allowed to settle at its unassisted rate, which is determined by the capacitance of the AC coupling capacitors. The limiting factor to the speed at which the capacitor is charged in the present embodiment is the ability of the internal voltage source of the reference voltage supply to drive a current, and the resistance in the switches.

The pulse itself may be extremely short. Precisely how short it needs to be depends upon a number of factors. As will be understood by those skilled in the art, 802.11a and 802.11b baseband signals are not continuous streams of data but are instead a series of packets. The start of each packet contains special training sequences where no data is carried. The DC offset recalibration in the AGC is preferably carried out during this training period. For 802.11b, there are a sufficient number of training symbols to allow perhaps 3–4 μsec for the overall recalibration procedure. 802.11a, by contrast, has a much lower number of training symbols and this in turn limits the calibration time to perhaps 1–2 μsec. Furthermore, because of the number of different data rates supported by the IEEE 802.11a standard, it is preferable to adjust the gain of the AGC once the rate is known, to obtain the best signal. This places still a further restriction on the total time available for adjusting the AGC, since both adjustment and settling then needs to take place during one of the guard intervals (where data is repeated) and this lasts only 0.8 μsec. Although the switches may be shut for about 1 μsec, in the preferred embodiment (to take into account the maximum time available in 802.11a signals) the pulse is therefore around 0.4 μsec (i.e. the capacitor charge time), with the switches remaining open a further 0.4 μsec to settle any glitches introduced by the clock feedthrough when the switches are opened.

The circuit of FIG. 3 can advantageously be implemented as a CMOS integrated circuit where the stages of the AGC circuit 80 can be high impedance and where switches can be implemented with metal oxide semiconductor (MOS) devices with low turn-on resistance and high turn-off resistance. The capacitor values of the coupling capacitors can then be around 1 picofarad, which can be easily implemented as chip capacitors.

Figure 4:
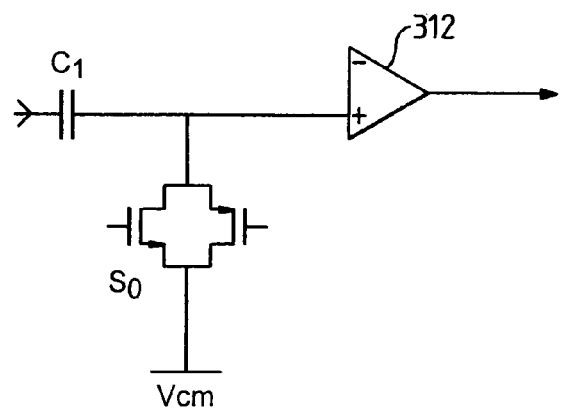
FIG. 4 shows an embodiment of a switch suitable for use with the circuit of FIG. 3.

FIG. 4 shows a circuit diagram of a part of the AGC circuit 80 of FIG. 3, illustrating a suitable implementation of a switch. For the sake of clarity, only the second stage of the AGC circuit 80, including the second operational amplifier 312, the first coupling capacitor C1 and the switch S1 is shown. The switch S0 is preferably a simple transmission gate that either shorts the capacitor C1 to the common mode reference $V_{cm}$ in the gain change mode, or isolates the voltage $V_{cm}$ so that the baseband signal 308 can instead pass through the capacitor C1 into the second operational amplifier 312 substantially without attenuation.

While a preferred embodiment has been described, it is to be understand that this is for the purpose of illustration only and is not intended to be restrictive. For example, although the AGC circuit 80 embodying the present invention has been described in connection with a receiver section of a wireless LAN, it is to be understood that it is equally applicable to the transmitter section, to single, dual to further multi-mode access points, and indeed to any other form of amplifier, whether employing automatic gain control or not, where AC coupling capacitors are employed and where it is necessary for the circuit to settle rapidly as a result of changes in the amplifier DC offset, without attenuating AC signals.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An amplifier circuit for amplifying an input signal, comprising:
    (a) an amplifier having an input and an amplifier output with a DC offset;
    (b) a coupling capacitor having first and second capacitor plates, the first plate being connected to the output of the amplifier;
    (c) switching means arranged to switch the circuit between a first mode, in which a DC reference voltage is isolated from the amplifier and capacitor so that the amplifier amplifies the input signal applied to the amplifier input, and the capacitor blocks the DC offset, and a second mode, in which the DC reference voltage is connected to the amplifier input and also to the second capacitor plate so that the voltage across the capacitor plates is forced to the DC offset; and
    (d) a detector to detect a change in a parameter of the circuit, or a change in an input thereto, which causes a change in the DC offset so that there is a new DC offset, and to cause the switching means to switch momentarily from the first mode thereof to the second mode thereof, to adjust the voltage across the capacitor to the new DC offset, before causing the switching means to switch back again to the first mode.

2. The circuit of claim 1, wherein the amplifier has a variable gain, a change in the amplifier gain causing a resultant change in the DC offset, the detector further operating to detect a change in the gain of the amplifier and to cause the switching means to switch to the said second mode in consequence thereof.

3. The circuit of claim 2, further comprising a gain controller arranged to monitor the amplitude of an input signal for the amplifier, and to vary the gain of the amplifier as a result of a change in the input signal amplitude so as to maintain a relatively constant amplifier output signal amplitude as the input signal amplitude alters.

4. An automatic gain controller (AGC) circuit, comprising: a chain of amplifier circuits, wherein each amplifier circuit comprises:
    (a) an amplifier having an input and an amplifier output with a DC offset;
    (b) a coupling capacitor having first and second capacitor plates, the first plate being connected to the output of the amplifier and wherein the second plate of a first amplifier circuit in the chain is connected to the input of the amplifier in a second amplifier circuit in the chain;
    (c) switching means arranged to switch the circuit between a first mode, in which a DC reference voltage is isolated from the amplifier and capacitor so that the amplifier amplifies the input signal applied to the amplifier input, and the capacitor blocks the DC offset, and a second mode, in which the DC reference voltage is connected to the amplifier input and also to the second capacitor plate so that the voltage across the capacitor plates is forced to the DC offset; and
    (d) a detector to detect when change in a parameter of the circuit, or a change in an input thereto, causes a change in the DC offset so that there is a new DC offset, and to cause the switching means to switch momentarily from the first mode thereof to the second mode thereof, to adjust the voltage across the capacitor to the new DC offset, before causing the switching means to switch back again to the first mode.

5. The AGC circuit of claim 4 wherein the AGC circuit is included within a receiver/transmitter section of an access point (AP) for a wireless local area network (WLAN).

6. The AGC circuit of claim 4 wherein the AGC circuit is included within a receiver/transmitter section of a client that is arranged to connect to an access point in a WLAN.

7. A method of DC offset control in an amplifier circuit including an amplifier which has an input and an output with a DC offset, and a coupling capacitor having first and second capacitor plates, the first plate being connected to the output of the amplifier; the method comprising:

detecting a change in a parameter of the circuit, or a change in an input thereto, which causes a change in the DC offset;

in response to the detected change, switching the circuit from a first mode, in which a DC reference voltage is isolated from the amplifier and capacitor so that the amplifier amplifies the input signal applied to the amplifier input and the capacitor blocks the DC offset, to a second mode in which the DC reference is connected to the amplifier input and also to the second capacitor plate so that the voltage across the capacitor plates is forced to the DC offset; and switching the circuit back from the second mode to the first mode once the voltage across the capacitor plates has been forced to the new DC offset.

8. The method of claim 7, wherein the step of detecting a change in a parameter of the circuit comprises detecting a change in the gain of the amplifier, which causes a change in the DC offset.

9. An automatic gain control (AGC) circuit, comprising:
a controllable gain amplifier having an input and an output;
a DC blocking capacitor having an input and an output wherein the input is connected to the controllable gain amplifier output; and
a circuit to selectively apply a reference DC voltage to both the controllable gain amplifier input and the DC blocking capacitor output comprising a first transistor switch having its source-drain terminals connected between the controllable gain amplifier input and the reference DC voltage and a second transistor switch having its source-drain terminals connected between the DC blocking capacitor output and the reference DC voltage.

10. The AGC circuit of claim 9 wherein the DC blocking capacitor has a capacitance selected such that it will allow passage of signals therethrough which have a frequency as low as about 100 kHz.

11. The AGC circuit of claim 9 wherein the selective application of the reference DC voltage causes the DC blocking capacitor to store a charge proportional to a DC voltage offset introduced by the controllable gain amplifier.

12. The AGC circuit of claim 9 wherein the circuit selectively applies the reference DC voltage in a pulse having a duration that is less than about 1 microsecond.

13. The AGC circuit of claim 12 wherein the duration is about 0.4microseconds.

14. The AGC circuit of claim 9 wherein the controllable gain amplifier and DC blocking capacitor are implemented as integrated circuit devices.

15. The AGC circuit of claim 14 wherein the circuit to selectively apply is also implemented as an integrated circuit device.

16. The AGC circuit of claim 9 wherein the DC blocking capacitor has a capacitance of about 1 picofarad.

17. An automatic gain control (AGC) circuit, comprising:
a first controllable gain amplifier having an input and an output;
a second controllable gain amplifier having an input and an output;
a DC blocking capacitor having an input and an output wherein the input is connected to the first controllable gain amplifier output and the output is connected to the second controllable gain amplifier input; and
a circuit to selectively apply a reference DC voltage to inputs of both the first and second controllable gain amplifiers comprising a transistor switch having its source-drain terminals connected between the input of each controllable gain amplifier and the reference DC voltage.

18. The AGC circuit of claim 17 wherein the selective application of the reference DC voltage causes the DC blocking capacitor to store a charge proportional to a DC voltage offset introduced by the first controllable gain amplifier.

19. The AGC circuit of claim 17 wherein the circuit selectively applies the reference DC voltage in a pulse having a duration that is less than about 1 microsecond.

20. The AGC circuit of claim 19 wherein the duration is about 0.4microseconds.

21. The AGC circuit of claim 17 wherein each of the controllable gain amplifiers and the DC blocking capacitor are implemented as integrated circuit devices.

22. The AGC circuit of claim 21 wherein the circuit to selectively apply is also implemented as an integrated circuit device.

23. The AGC circuit of claim 17 wherein the DC blocking capacitor has a capacitance of about 1 picofarad.

24. The AGC circuit of claim 17 further comprising another DC blocking capacitor connected to an input of the first controllable gain amplifier.

25. The AGC circuit of claim 17 further comprising another DC blocking capacitor connected to an output of the second controllable gain amplifier.

26. The AGC circuit of claim 25 wherein the circuit further selectively applies the reference DC voltage an output of the another DC blocking capacitor.

27. In an automatic gain control (AGC) circuit having an automatic gain controlled amplifier connected in series with a DC blocking capacitor, a method, comprising:
detecting a change in an operating parameter of the AGC circuit, wherein the change in the operating parameter causes a change in a DC voltage offset of the automatic gain controlled amplifier; and
in response to the detected change, selectively applying a reference DC voltage to an input of the automatic gain controlled amplifier and to an output of the DC blocking capacitor output so as to cause the DC blocking capacitor to store a charge proportional to a DC voltage offset introduced by the controllable gain amplifier.

28. The method of claim 27 further including the step of detecting a change in the gain of the automatic gain controlled amplifier, the step of selectively applying being performed in response to the detected change.

29. The method of claim 27 wherein selectively applying comprises momentarily applying the reference DC voltage.

30. The method of claim 29 wherein the momentarily applying step applies the reference DC voltage in a pulse having a duration that is less than about 1 microsecond.

31. The method of claim 30 wherein the duration is about 0.4microseconds.

* * * * *